(12) United States Patent
Wiltsche et al.

(10) Patent No.: US 9,030,797 B2
(45) Date of Patent: May 12, 2015

(54) THIN SUBSTRATE ELECTROSTATIC CHUCK SYSTEM AND METHOD

(75) Inventors: Ewald Wiltsche, Maria Saal (AT); Peter Zupan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/485,975

(22) Filed: Jun. 1, 2012

(65) Prior Publication Data

US 2013/0321973 A1    Dec. 5, 2013

(51) Int. Cl.
*H01T 23/00* (2006.01)
*H02N 13/00* (2006.01)
*H01L 21/683* (2006.01)

(52) U.S. Cl.
CPC ........... *H02N 13/00* (2013.01); *Y10T 29/49117* (2015.01); *H01L 21/6831* (2013.01); *H01L 21/6833* (2013.01)

(58) Field of Classification Search
USPC .................................................. 361/234, 230
See application file for complete search history.

(56) References Cited

U.S. PATENT DOCUMENTS

| | | | | |
|---|---|---|---|---|
| 4,897,171 | A * | 1/1990 | Ohmi | 204/298.15 |
| 2002/0141134 | A1* | 10/2002 | Frutiger | 361/234 |
| 2004/0218340 | A1* | 11/2004 | Kitabayashi et al. | 361/234 |
| 2006/0199353 | A1* | 9/2006 | Kub et al. | 438/455 |
| 2010/0188794 | A1* | 7/2010 | Park et al. | 361/234 |

* cited by examiner

*Primary Examiner* — Danny Nguyen (57) ABSTRACT

In various aspects of the disclosure, a semiconductor substrate processing system may include an electrostatic chuck for holding a semiconductor substrate attached to an electrically insulating carrier; and an AC power supply electrically coupled to the electrostatic chuck.

34 Claims, 11 Drawing Sheets

THIN SUBSTRATE ELECTROSTATIC CHUCK SYSTEM AND METHOD

TECHNICAL FIELD

Various aspects of the disclosure relate generally to an electrostatic chuck used to secure substrates during semiconductor processing.

BACKGROUND

As part of the semiconductor device manufacturing process, it is often necessary to support, for instance, a semiconductor substrate that acts as a substrate for the various device layers built-up in the device. Often used is a device called a chuck. Mechanical chucks typically include some type of mechanical pin to hold the substrate. The problem with this type of arrangement is that it can tend to damage the edges of the substrate. This problem is magnified when thin substrates are used in the process. Therefore, it may be desirable to improve the ability to support thin substrates during the manufacturing process. This is especially important for larger substrates, up to, for instance, 300 mm in size.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the disclosure of the invention are described with reference to the following drawings, in which.

DESCRIPTION

In various aspects of the disclosure, electrostatic chucks may be provided that may include a power supply. In one or more embodiments, the power supply may be an AC power supply. In one or more embodiments, the power supply may be a high-voltage power supply. Moreover, in a further aspect, the high voltage power supply may be used in conjunction with thin semiconductor substrates. The thin semiconductor substrates may be optionally supported on glass or other non-conducting carriers. The thin semiconductor substrates may range up to 300 mm in size, or greater. Optionally, the power supply may be modified to better support high-voltage operation without arcing. Optionally, the power cabling used may be modified to better support high-voltage operation. In another aspect of the invention, non-conducting carriers used to support thin semiconductor substrates may be sputtered with a thin layer of conductive material. Further, the system may be used for conventional semiconductor substrates as well as supported thin substrates. Optionally, the system is able to automatically detect the substrate type.

The following detailed description refers to the accompanying drawings that show, by way of illustration, specific details and aspects of the disclosure in which embodiments may be practiced. These aspects of the disclosure are described in sufficient detail to enable those skilled in the art to practice certain embodiments. Other aspects of the disclosure may be utilized and structural, logical, and electrical changes may be made without departing from the scope of the invention. The various aspects of the disclosure are not necessarily mutually exclusive, as some aspects of the disclosure can be combined with one or more other aspects of the disclosure to form new aspects of the disclosure. The following detailed description therefore is not to be taken in a limiting sense, and the scope of the present invention is defined by the appended claims.

Various aspects of the disclosure are provided for devices, and various aspects of the disclosure are provided for methods. It will be understood that basic properties of the devices also hold for the methods and vice versa. Therefore, for sake of brevity, duplicate description of such properties may be omitted.

The term "at least one" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The terms "disposed over", "located over" or "arranged over" as used herein are intended to include arrangements where a first element or layer may be disposed, located or arranged directly on a second element or layer with no further elements or layers in-between, as well as arrangements where a first element or layer may be disposed, located or arranged above a second element or layer with one or more additional elements or layers between the first element or layer and the second element or layer.

Electronic devices are typically built using semiconducting materials. The manufacturing process involves many steps, typically starting with a bare semiconductor substrate. The semiconductor substrate material often comprises silicon, due to the range of conductivities available, durability, and relatively low cost of this material. Typical silicon substrates have a thickness of between 600-1000 µm, although this thickness can vary widely. During processing, both in transfer between various pieces of machinery and during the actual processing step, the substrate must be held in place. This is typically done using a gripping arm including a chuck, which is used to hold the semiconductor substrate. As used herein, the term "semiconductor substrate" includes all substrates which may be used to manufacture semiconductor devices including, without limitation, silicon, silicon on insulator (SOI), germanium, germanium/silicon, indium phosphide and gallium arsenide substrates, for example.

A chuck can take a number of different forms, including a mechanical chuck (comprising pins to hold the substrate in place), a vacuum chuck (comprising a vacuum force to hold the substrate in place), or an electrostatic chuck (comprising an electrostatic chuck to hold the substrate in place). Electrostatic chucks are described in more detail below.

Figure 1A:
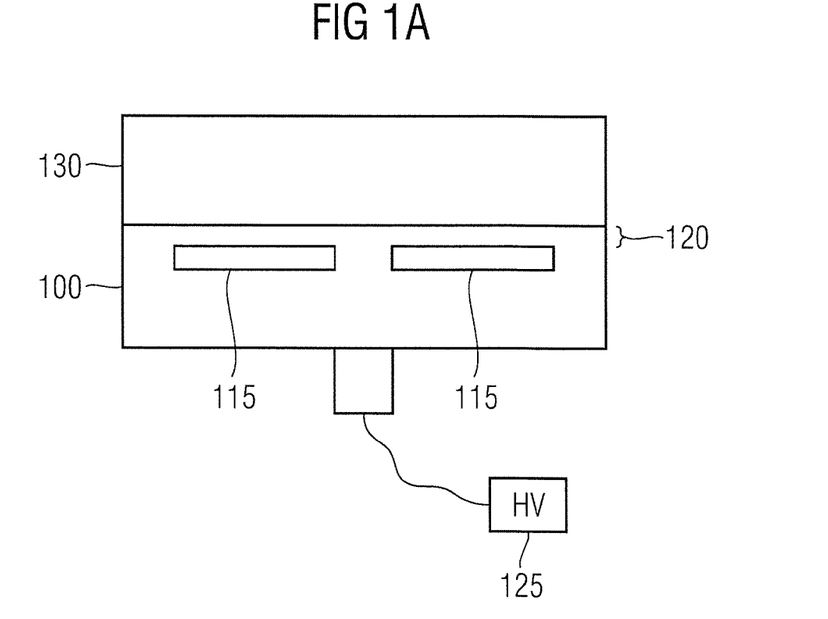
FIGS. 1A-1B illustrate an electrostatic chuck.
Figure 1B:
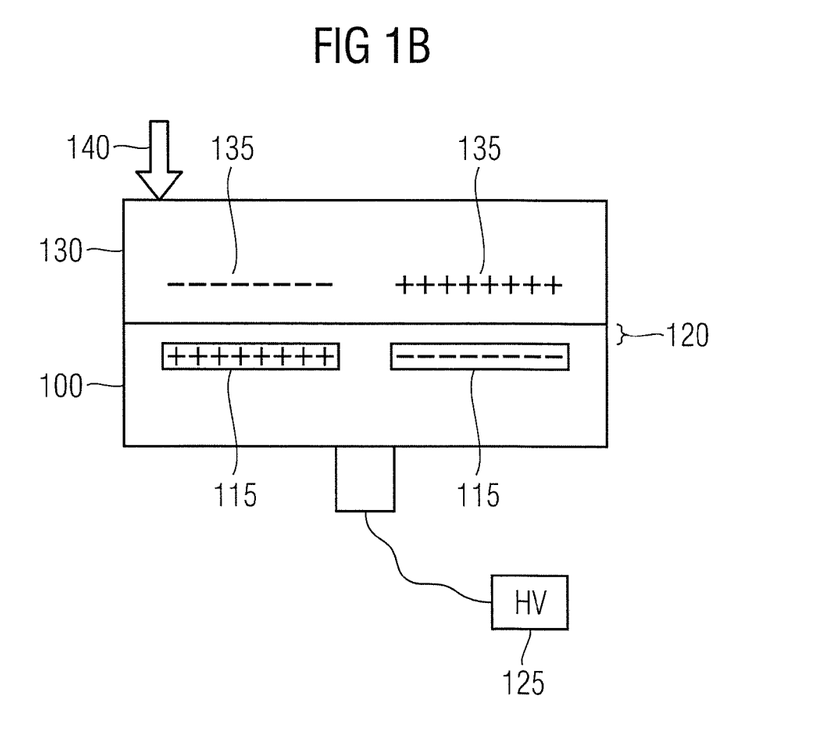

FIG. 1 illustrates the operation of an exemplary electrostatic chuck. The electrostatic chuck 100 includes one or more electrodes 115 and a dielectric 120. Dielectric 120 can comprise any number of materials, depending on the application. Exemplary dielectrics include alumina, quartz, sapphire, and polyimide, for instance. Electrostatic chuck 100 is further connected to a high-voltage power supply 125. Power supply 125 is used to supply a high voltage to electrodes 115.

Semiconductor substrate 130 is placed adjacent to chuck 100. Once semiconductor substrate 130 is in contact with chuck 100, power supply 125 is activated, as shown in FIG. 1B. Activation of power supply 125 induces a strong electric field in the region of electrodes 115. In the case of the two-electrode design depicted in FIG. 1, this results in regions of positive and negative charge in chuck electrodes 115. In areas of semiconductor substrate 130 across from the regions of positive and negative charge in chuck electrodes 115, regions of opposing sign are induced 135, resulting in a positive grip pressure 140 due to the opposing charges. Semiconductor substrate 130 is held in place through grip force 140.

Voltage is typically applied to the chuck electrodes 115 in one of two ways, either as a direct current (DC) or an alternating current (AC). DC systems typically are slower than AC systems, due in part to slower residual charge dissipation in the substrate. Therefore, for applications where high throughput is desired, an AC chuck may be preferred. Moreover, as discussed further below, AC chuck systems enable semiconductor substrate detection through the detection of AC clamp current. This is not available on DC systems as there is no clamp current due to the presence of the semiconductor substrate, which acts as a capacitive load. Note that the above electrostatic chuck description assumes that a conductive or semiconductive substrate is present.

However, due to market demands to decrease device size, especially with respect to mobile electronic devices, as well as increasing demand for less power dissipation in electronic devices in general, especially in vertically connected power electronic semiconductor devices, the thickness of semiconductor substrates has steadily decreased. A typical thin semiconductor substrate may have a thickness of between 70-200 µm, for instance. As the thickness of semiconductor substrates has decreased, the difficulty in handling during processing due to the fragile nature of the thinner semiconductor substrates has increased. One method of dealing with the thinner semiconductor substrates has been to bond the semiconductor substrate to a support structure, for instance.

Figure 2A:
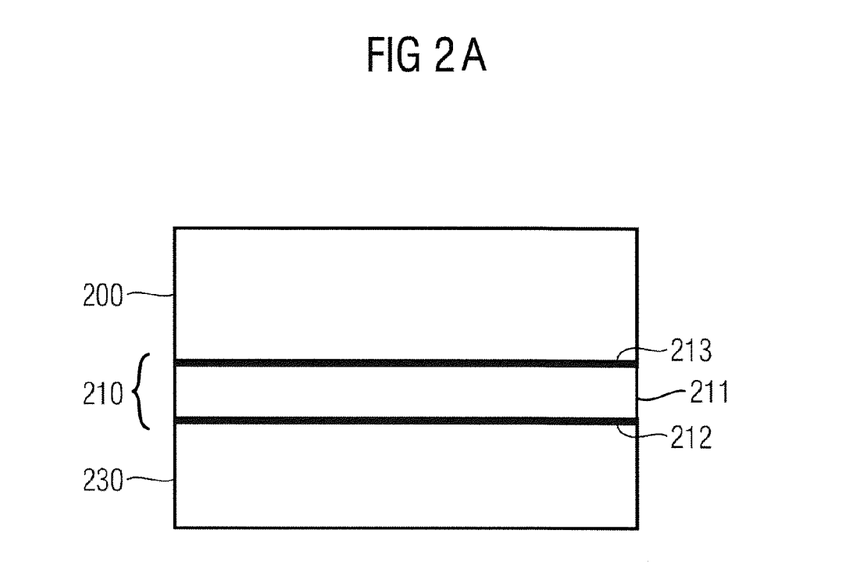
FIG. 2A illustrates a silicon on glass structure in accordance with an aspect of the disclosure.

An example of such a structure is illustrated in FIG. 2A. A semiconductor substrate 200 is bonded to a layer of adhesive material 210. Adhesive material 210 is polymeric, and it comprises a center layer 211 with a tacky adhesive 212, 213 on both sides. One layer of adhesive 213 is bonded to semiconductor substrate 200, and the other layer of adhesive 212 is bonded to a support structure, referred to as a carrier 230. Carrier 230 may comprise any material suitable for supporting the semiconductor substrate. According to an aspect of the disclosure, the carrier comprises glass. In an embodiment, the glass used is borosilicate glass. The structure formed by the semiconductor substrate, adhesive, and glass (carrier) is referred to herein as a "silicon-on-glass (SOG)" workpiece (assuming a silicon substrate is used with a glass carrier) although other names may be used in the art.

The SOG workpiece provides structural integrity, by providing a thicker, and hence more rugged, substrate for handling during processing. However, the glass carrier is not conductive. This tends to restrict SOG workpieces to processes using substrate-handling methods that do not require the application of an electric field to the substrate, such as mechanical methods. These methods have certain drawbacks associated with them, including the possibility of particle generation or damage to the substrate; they are slower and less reliable then electrostatic chuck systems; and mechanical clamping tools do not allow so-called "Quad mode wafer processing" (e.g. different impact angles at implanter tools) or other types of back-side processing. Quad mode wafer processing applications are discussed further below. As electrostatic methods do not induce contact with the edges of the semiconductor substrate and allow back-side processing, such as Quad-mode processing, it is desirable to be able to use such methods with SOG workpieces.

Figure 2B:
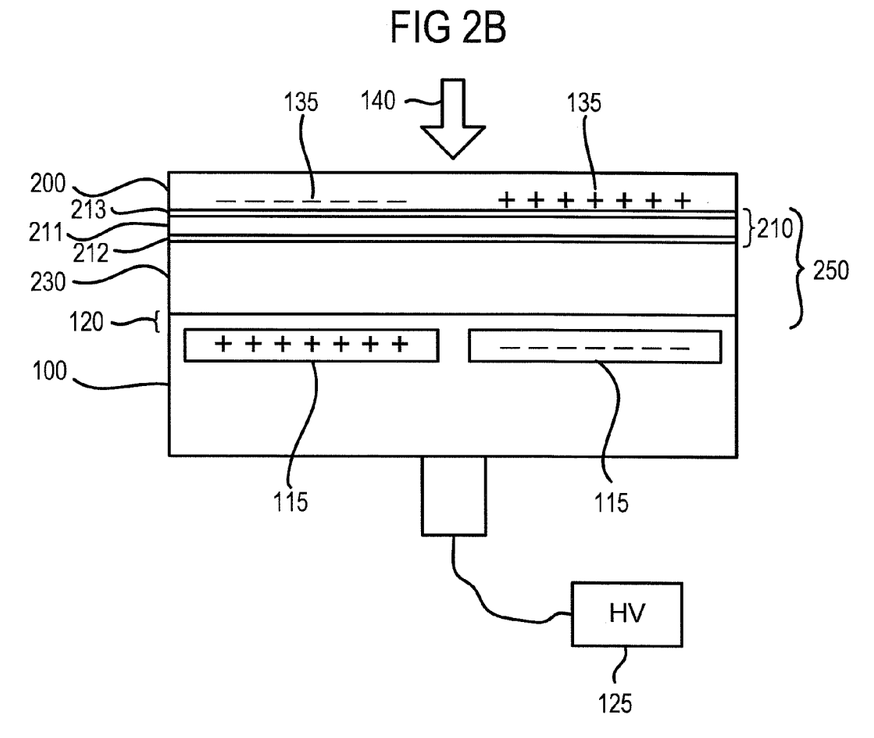
FIG. 2B illustrates an electrostatic chuck in accordance with another aspect of the disclosure.

A semiconductor substrate without or with a glass or other insulating carrier may, when placed adjacent to an electrostatic chuck 100 as illustrated in FIG. 1B and FIG. 2B, form a capacitor (where FIG. 1B illustrates an example of a semiconductor substrate 130 without insulating carrier, and FIG. 2B illustrates an example of a semiconductor substrate 200 with insulating carrier 230). The capacitance can be estimated from certain properties of the insulating layer, according to the following relationship:

$$C = \varepsilon_0 \cdot \varepsilon_r \cdot \frac{A}{d} \quad (1)$$

where C is the capacitance; $\varepsilon_0$ is the vacuum permittivity; $\varepsilon_r$ is the (material specific) relative static permittivity; A is the area of overlap between the plates forming the capacitor (according to the examples illustrated in FIG. 1B and FIG. 2B, the semiconductor substrate 130 or 200 and the electrodes 115); and d is the thickness of the insulating layer or layer stack between the plates (for example, the thickness of layer 120 in FIG. 1B, or the thickness of insulating layer stack 250 formed by layers 213, 211, 212, 230, and 120 in FIG. 2B).

In case that a layer stack including a plurality of insulating layers is formed between the plates (for example insulating layer stack 250 formed by layers 213, 211, 212, 230 and 120 in FIG. 2B), and taking the properties of the individual insulating layers into account, the capacitance may be estimated according to the following relationship:

$$C = \varepsilon_0 \cdot A \cdot \left(\frac{d_1}{\varepsilon_{r_1}} + \frac{d_2}{\varepsilon_{r_2}} + \frac{d_3}{\varepsilon_{r_3}} + \ldots + \frac{d_n}{\varepsilon_{r_n}}\right)^{-1} \quad (2)$$

where C, $\varepsilon_0$, and A are the same as above, and $\varepsilon_{r_i}$ and $d_i$ ($i \leq 1 \leq n$, n being the total number of insulating layers in the layer stack) are the relative static permittivity and the thickness, respectively, of the i-th layer of the layer stack.

Applying a voltage to a structure having a capacitance C results in a force, F (indicated as arrow 140 in FIG. 1B and FIG. 2B, for instance), that can be calculated using the following relation:

$$F = \frac{u^2}{d} \cdot C \quad (3)$$

where F is the clamping force; u is the applied root mean square (RMS) AC voltage; d is the (overall) thickness of the insulating layer or layer stack (for example, the thickness of layer 120 in FIG. 1B, or the overall thickness of the layer stack formed by layers 213, 211, 212, 230, and 120 in FIG. 2B; and C is the capacitance.

Substituting relationship (1) into relationship (3) results in the following relationship:

$$F = \frac{u^2 \cdot \varepsilon_0 \cdot \varepsilon_r \cdot A}{d^2} \quad (4)$$

From this, the voltage u required for a given clamping force F, certain dielectric material $\varepsilon_r$, area of overlap A, and constant thickness of insulating layer d, can be calculated:

$$u = \sqrt{\frac{F \cdot d^2}{\varepsilon_0 \cdot \varepsilon_r \cdot A}} \quad (5)$$

For the purposes of this disclosure, the resulting RMS voltage ($V_{rms}$) can be converted to peak to peak voltage ($V_{pp}$) by multiplying by 1.75. It should be noted that in case that an insulating layer stack including a plurality of insulating layers is provided, relationship (2) may be substituted into relationship (3), which may yield a slightly more complex expression for voltage u, as will be readily understood by those skilled in the art.

Figure 9:
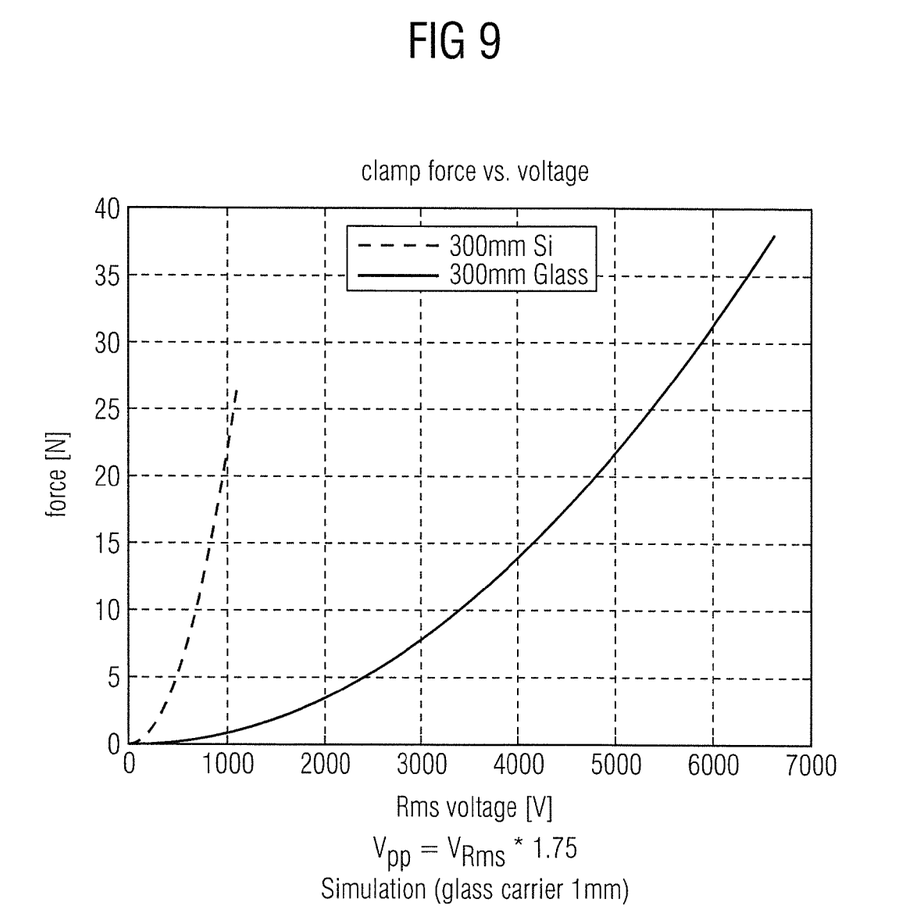
FIG. 9 illustrates a calculation of applied voltage in accordance with an aspect of the disclosure.
Figure 10:
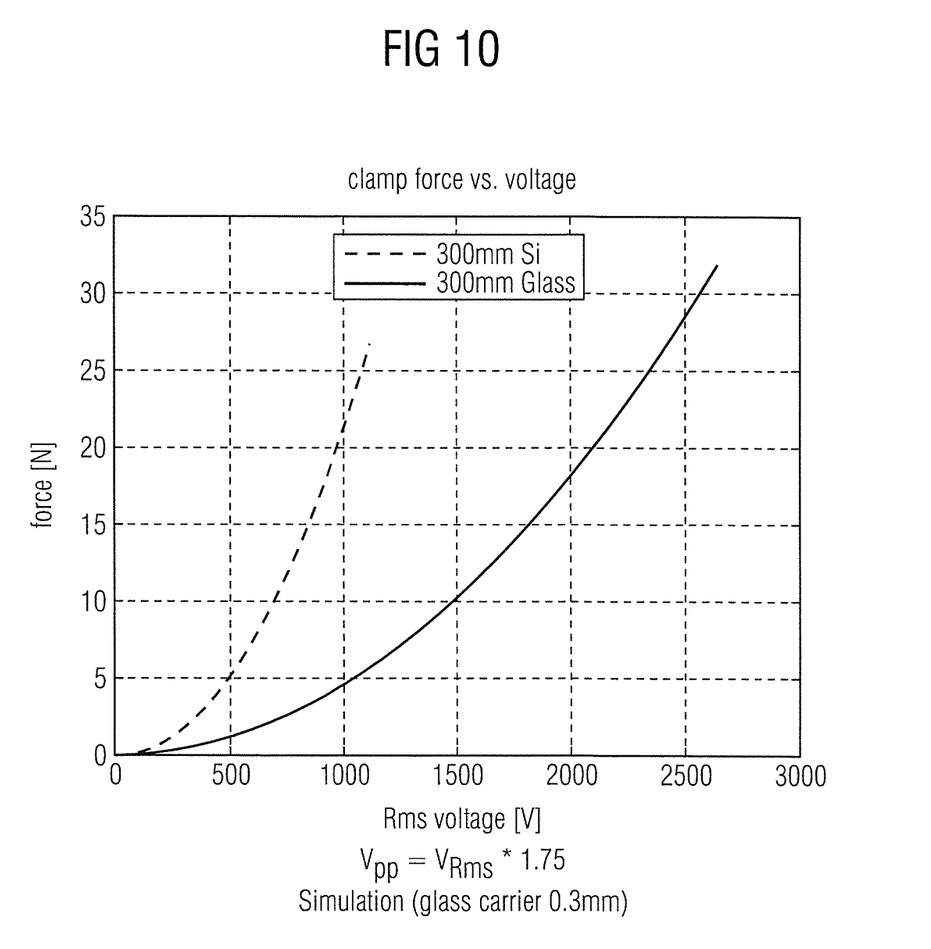
FIG. 10 illustrates another calculation of applied voltage in an aspect of the disclosure.

Examples of graphs created using the relationship (5) for two differing glass carrier thicknesses appear in FIGS. 9 and 10. A plot of applied voltage versus clamping force required for a standard 300 mm silicon wafer is included on both Figures for reference.

For example, in an embodiment, an electrostatic clamping force of 6 N or more is required for a conventional (thick) silicon substrate 300 mm in size. Moreover, the clamping force required to hold a given substrate with an electrostatic chuck is approximately linearly related to the weight of the clamped object. The weight of a silicon substrate with an attached 1 mm thick glass carrier is approximately 1.6 time the weight of a bare semiconductor substrate. Therefore the clamping force required for a 300 mm substrate with an 1 mm glass carrier attached may be greater than 10 N. From FIG. 9, it may be estimated that a RMS (root mean square) voltage of greater than or equal to about 3.4 kV, corresponding to a voltage of about 6 kV peak to peak, is required. Referencing FIG. 10, a similar calculation using a glass carrier with a thickness of 0 3 mm (which weighs approximately 0.8 times the weight of a conventional silicon substrate) yielded a minimum RMS voltage of about 1 kV, corresponding to a voltage of about 1.75 kV peak to peak, to supply the necessary minimum force of 4.8 N. Therefore, according to various aspects of the disclosure, electrostatic chuck may be capable of providing a voltage which supplies a clamping force adequate to clamp substrates comprising a range of sizes and weights. In one embodiment, the substrate may comprise a 300 mm silicon substrate attached to an insulating carrier.

Figure 3:
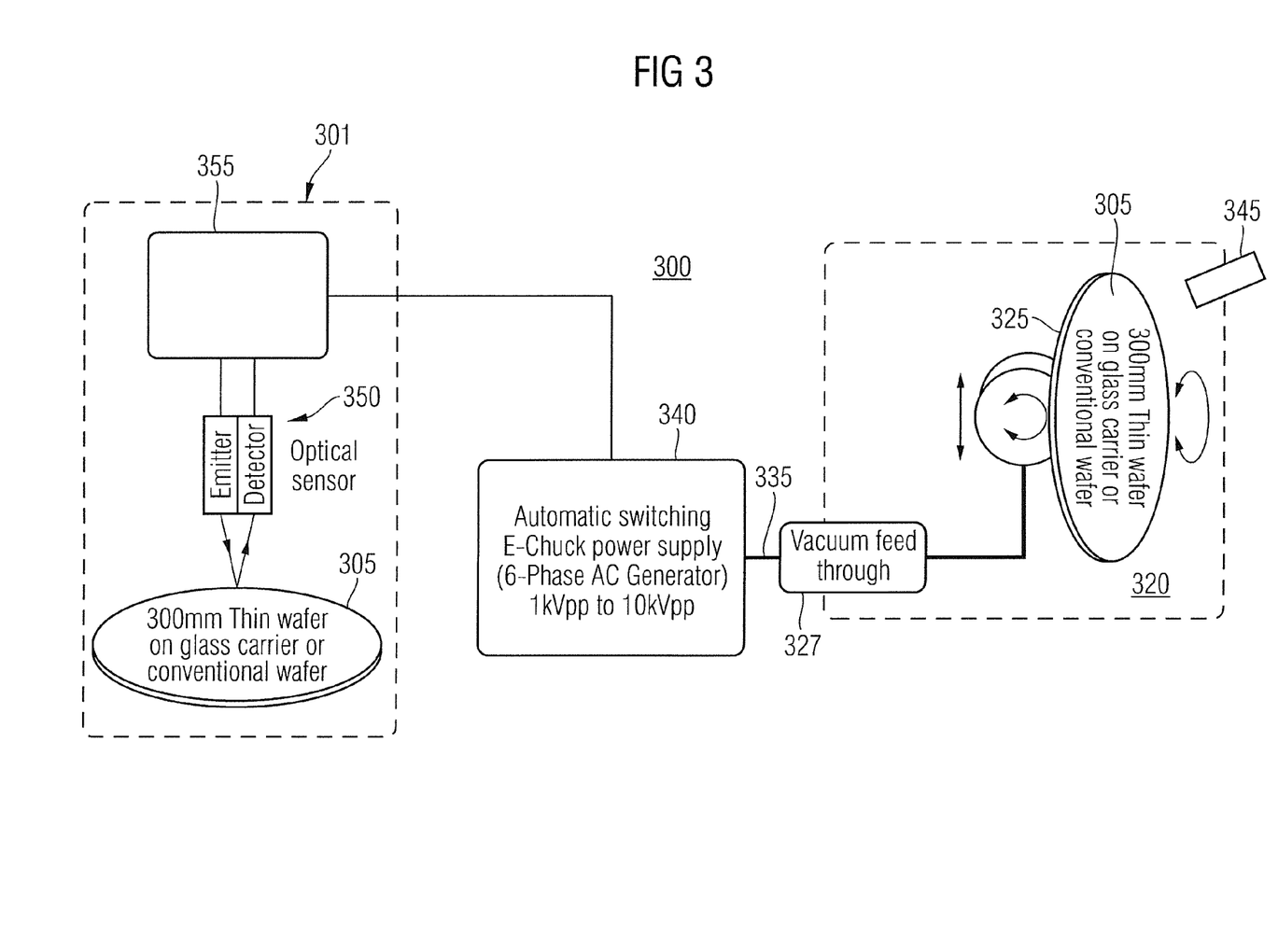
FIG. 3 illustrates a system in accordance with another aspect of the disclosure.

FIG. 3 illustrates an electrostatic chuck system 300 according to an embodiment of the disclosure. System 300 includes a conventional substrate handling system 301 for handling, for instance, semiconductor substrates. In an embodiment, the system is configured to handle semiconductor substrates up to 300 mm in size, although in principle the current system may be extended to larger substrates, thus this embodiment should not be read to limit the size of substrate which may be handled through this technique. The conventional substrate handling system 301 is used to transfer substrates 305 to and from other substrate-processing equipment, for instance. The conventional substrate handling system is oriented perpendicularly, as illustrated in FIG. 3. The conventional substrate handling system 301 further includes an optical sensing system 350.

The conventional substrate handling system 301 is coupled to vacuum chamber 320, and may be located within vacuum chamber 320. Inside vacuum chamber 320, and accessible to transfer arm (not shown) of conventional substrate handling system 301, is an electrostatic chuck 325. Electrostatic chuck 325 is electrically connected to a high-voltage power supply 340. Power supply 340 is attached to electrostatic chuck 325 by high-voltage cables 335 which are routed into vacuum chamber 320 through a vacuum feed-through 327. Further included within vacuum chamber 320 is a processing tool 345. The processing tool 345 may comprise any number of processing tools, as discussed further below.

Power-supply 340 is further coupled to optical sensor 350 included in substrate handling system 301. Optical sensor 350 comprises a discrimination means 355 for analyzing reflected light. Several of the components will now be discussed in greater detail.

Figure 4:
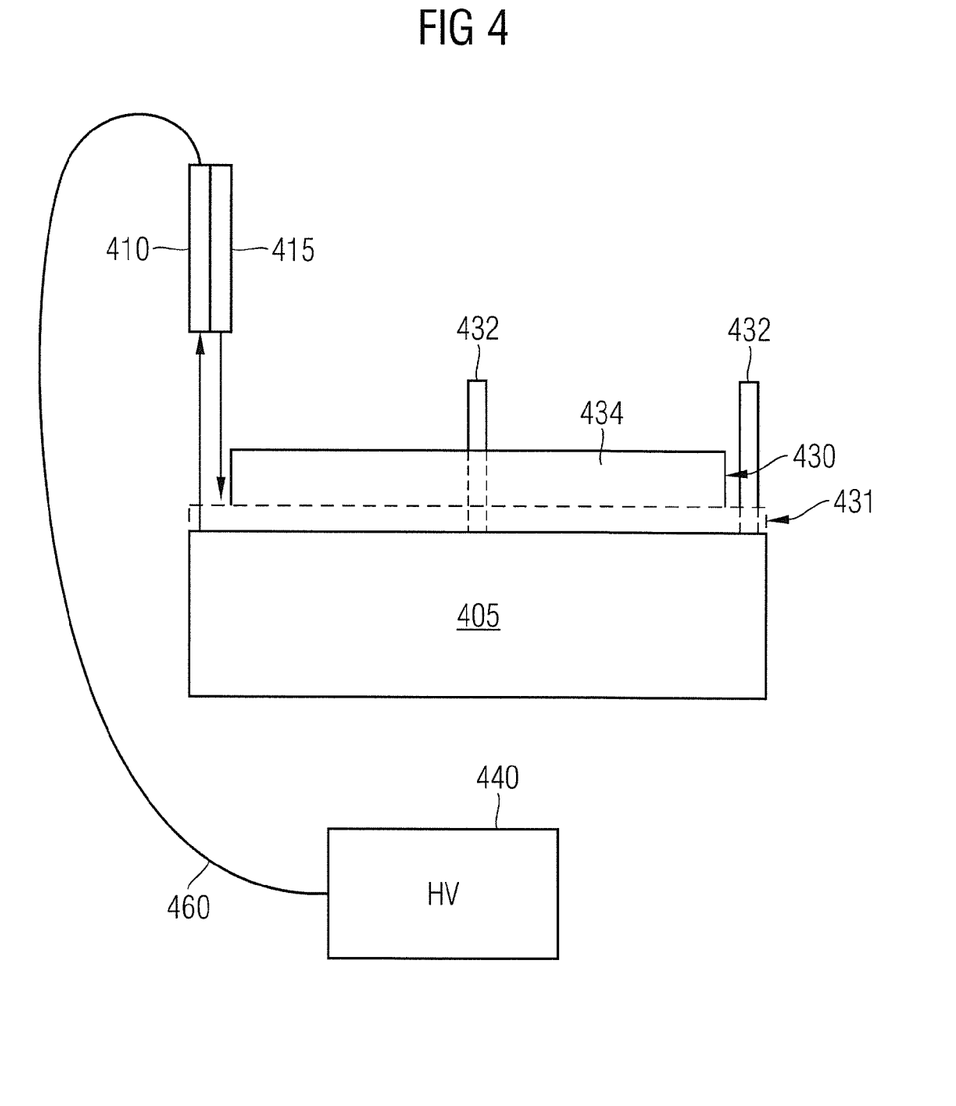
FIG. 4 illustrates a system component in accordance with another aspect of the disclosure.

FIG. 4 illustrates a non-electrostatic chuck 405 in accordance with an aspect of the disclosure. Non-electrostatic chuck 405 can be used in either vacuum or non-vacuum environments. Non-electrostatic chuck 405 can be used for both thin semiconductor substrates on glass carriers and for conventional semiconductor substrates. Non-electrostatic chuck 405 is a horizontally-oriented substrate-handling device. Non-electrostatic chuck 405 comprises pins 432 for stabilizing a workpiece 434 on non-electrostatic chuck 405. In an embodiment, three pins 432 are used to stabilize the workpiece 434, although one of the pins is not shown in FIG. 4 for reasons of clarity. In an embodiment, the workpiece 434 may be configured as an SOG workpiece, including a semiconductor substrate 430 attached to an insulating glass carrier 431, as shown.

The system further includes an optical sensing system. The optical sensing system comprises an emitter 415 and a sensor 410. Emitter 415 is an RGB (red LED, green LED, blue LED) light source. Light source 415 is oriented toward the substrate surface. The optical sensing system further comprises a sensor 410. Sensor 410 is used to distinguish the type of substrate present. Light source 415 illuminates the outside edge of SOG workpiece 434 when the workpiece 434 is brought into place, and sensor 410 detects the reflected light. SOG workpieces such as SOG workpiece 434, in an embodiment, are manufactured to include a glass carrier 431 that is slightly larger than the attached semiconductor substrate 430. In an embodiment, glass carrier 431 may be 1 mm larger in diameter than the attached semiconductor substrate 430. Light source 415 is oriented so that the light from the light source 415 either passes through the glass carrier 431 at the edge of the SOG workpiece 434 and is reflected off of the non-electrostatic chuck 405, or it is reflected from the surface of the non-electrostatic chuck 405, if no glass is present. The reflected light is detected by the sensor 410 in both cases. Depending on the ratio of the various wavelengths of light detected, sensor 410 is able to distinguish whether the substrate(s) currently in the system are silicon or silicon-on-glass, for example. However, the details of the light discrimination process are not important for the purposes of this disclosure, and will not be discussed further. Sensor 410 is interfaced to the HV Power supply 440 through an interface cable 460. Once sensor 410 has determined the type of substrate entering the system, it signals HV power supply 440 of the type of substrate. HV power supply 440 then switches to the proper supply voltage and to the proper substrate detection mode through the current monitoring device prior to processing, as will be discussed further below.

Figure 5:
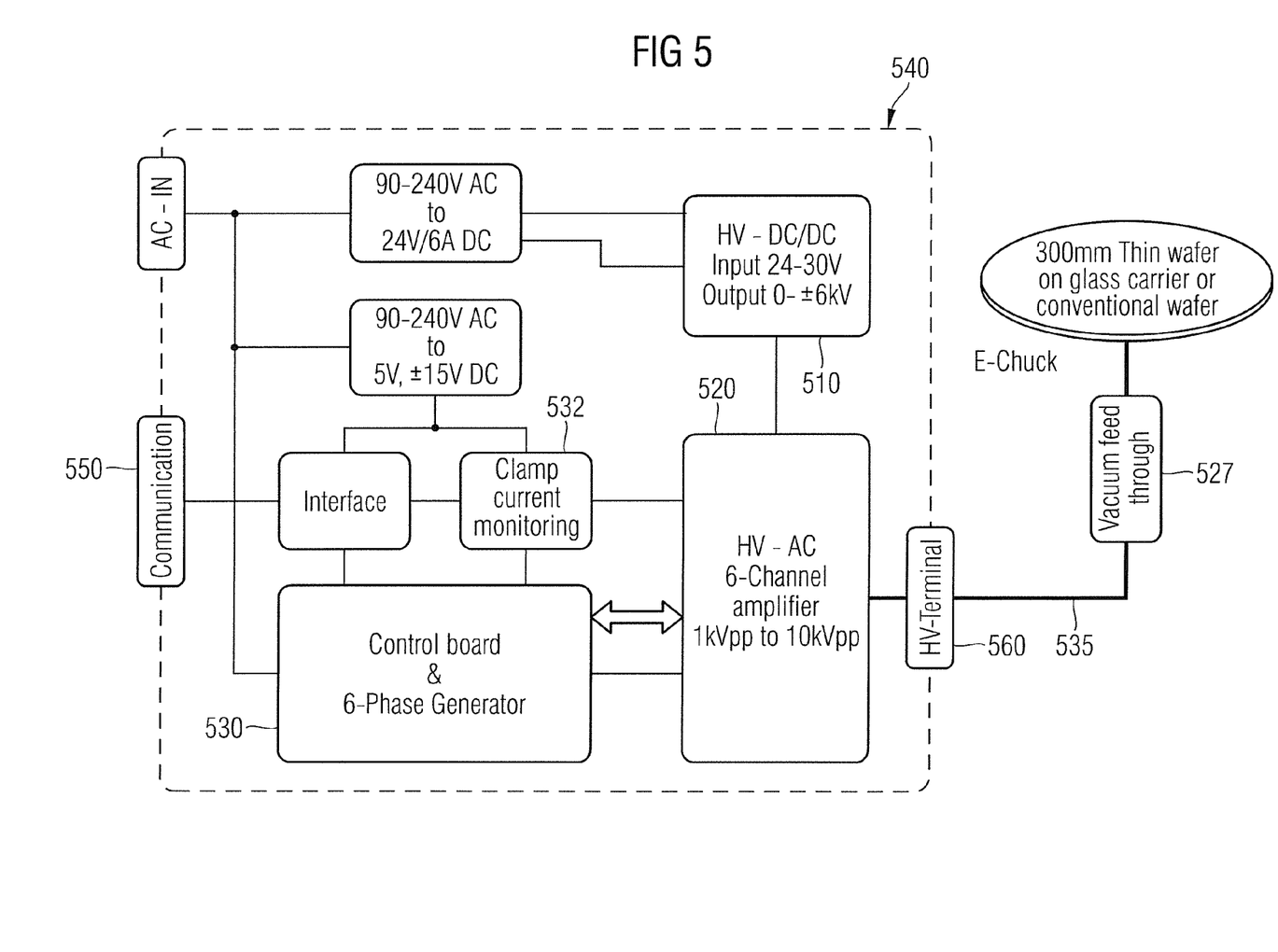
FIG. 5 illustrates a system component in accordance with another aspect of the disclosure.

FIG. 5 illustrates HV power supply 540 in accordance with an aspect of the disclosure. The power supply may be an AC power supply, for example a 6-phase, high-voltage AC power supply in accordance with an embodiment. In an aspect of the disclosure, the power supply may provide voltages ranging from 500 to 10,000 volts, peak to peak. Power supply 540 includes a high voltage DC to DC amplifier board 510 and a high voltage AC 6-channel amplifier 520 for amplifying the generated 6-phase voltage. The 6-phase voltage is generated using a control board and 6-phase generator 530. Six-phase generator 530 is coupled to input 550 from optical sensing system. Six-phase generator 530 is also coupled by 550 to a conventional control system, which controls the voltage for clamping and declamping of substrates. The input 550 from the optical sensing system is used as an input to control the voltage supplied by the power supply. When the optical sensor senses, for instance, a standard silicon substrate in position for insertion into the vacuum processing system, the HV power supply will output a voltage compatible with such a substrate. In an embodiment, the voltage will be set to 2000 V peak to peak for a standard silicon substrate. In another embodiment, the voltage is set to a higher voltage when a SOG workpiece is positioned for entry into the system. In an embodiment, the voltage will be set to a range of 6000-8000 volts peak to peak, for instance. The voltage used will vary widely, and also higher voltage could be required. In an embodiment, the voltage may range as high as 10,000 Volts peak to peak, or higher. In a further embodiment, switching may be controlled through manual means, such as a bayonet switch on a panel, for instance.

The power supply further includes a high-voltage terminal 560. The high-voltage terminal 560 may be constructed of materials which can withstand the high AC voltages generated by power supply 540.

The HV terminal 560 is further connected to high voltage cables 535. In an embodiment, HV terminal is a high-voltage (15 kV) BNC connector, and the high-voltage cables 535 are also specified to 15 kV. High voltage cables 535 are used to connect the high voltage power supply to the vacuum chamber (not shown in FIG. 5). As with the other components used in the object of the disclosure, the cables, and the harness used to route and contain the cables, may be constructed in such a way as to allow the use of voltages up to 15 kV. The high voltage cables 535 are connected to the vacuum system through a vacuum feed-through 527, which also may be certified to 15 kV.

Power supply 540 further includes a clamp current monitoring device 532. Clamp current monitoring device 532 is used to monitor the current applied to the electrostatic chuck, for instance. Current information is used to provide information about the presence or absence of a substrate on the electrostatic chuck to the conventional control system. The interlock is used to avoid, for instance, implant processing without substrate on electrostatic chuck.

Figure 6A:
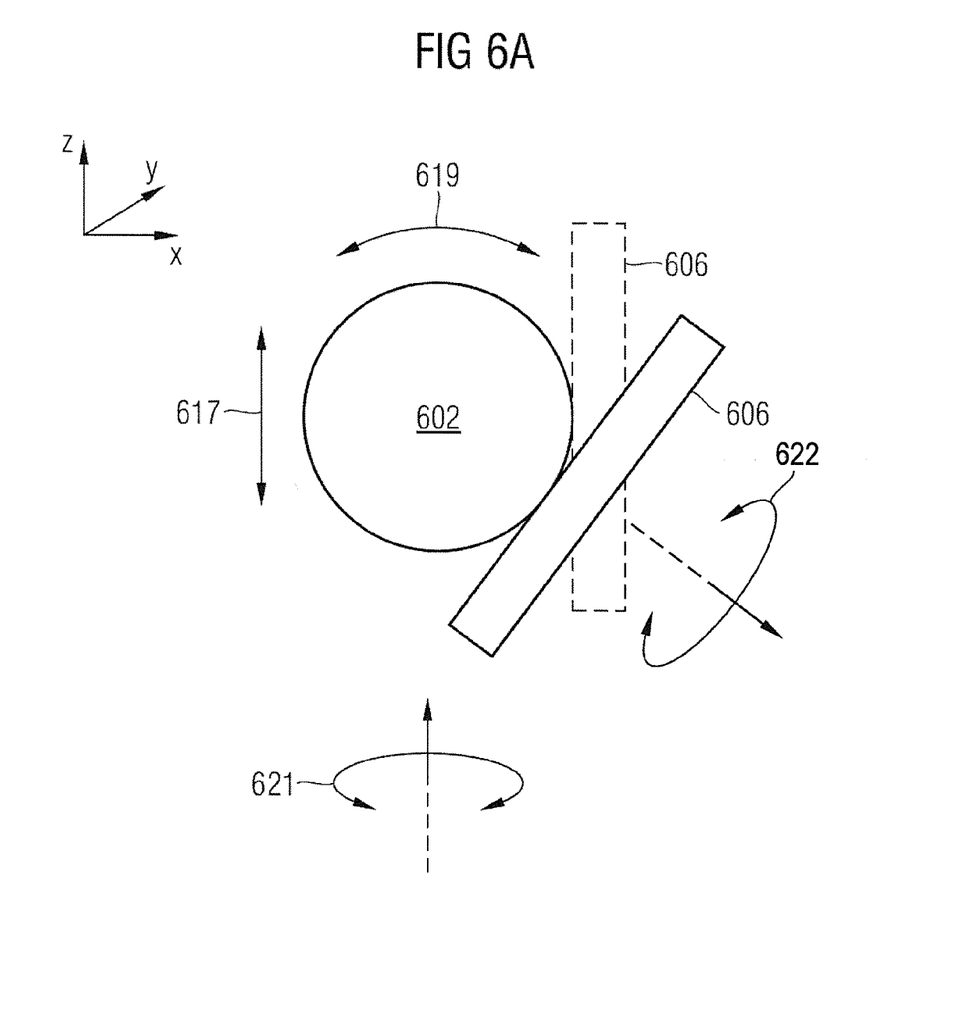
FIGS. 6A-6C illustrate system components in accordance with another aspect of the disclosure.
Figure 6B:
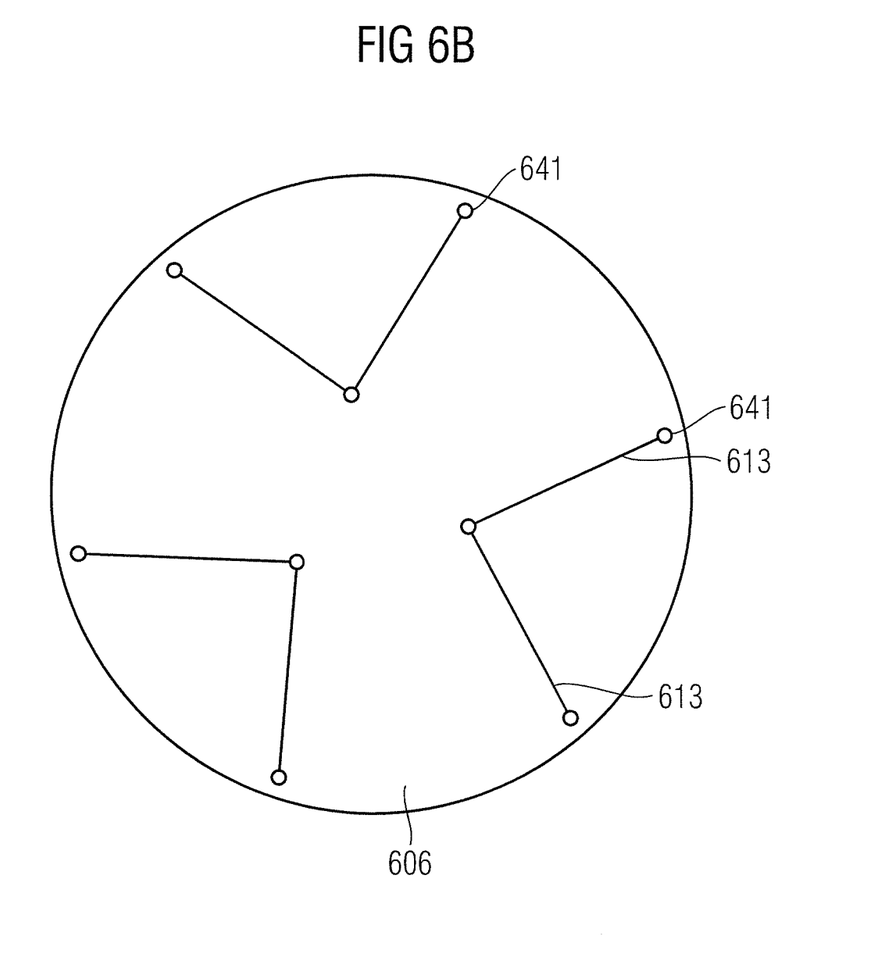
Figure 6C:
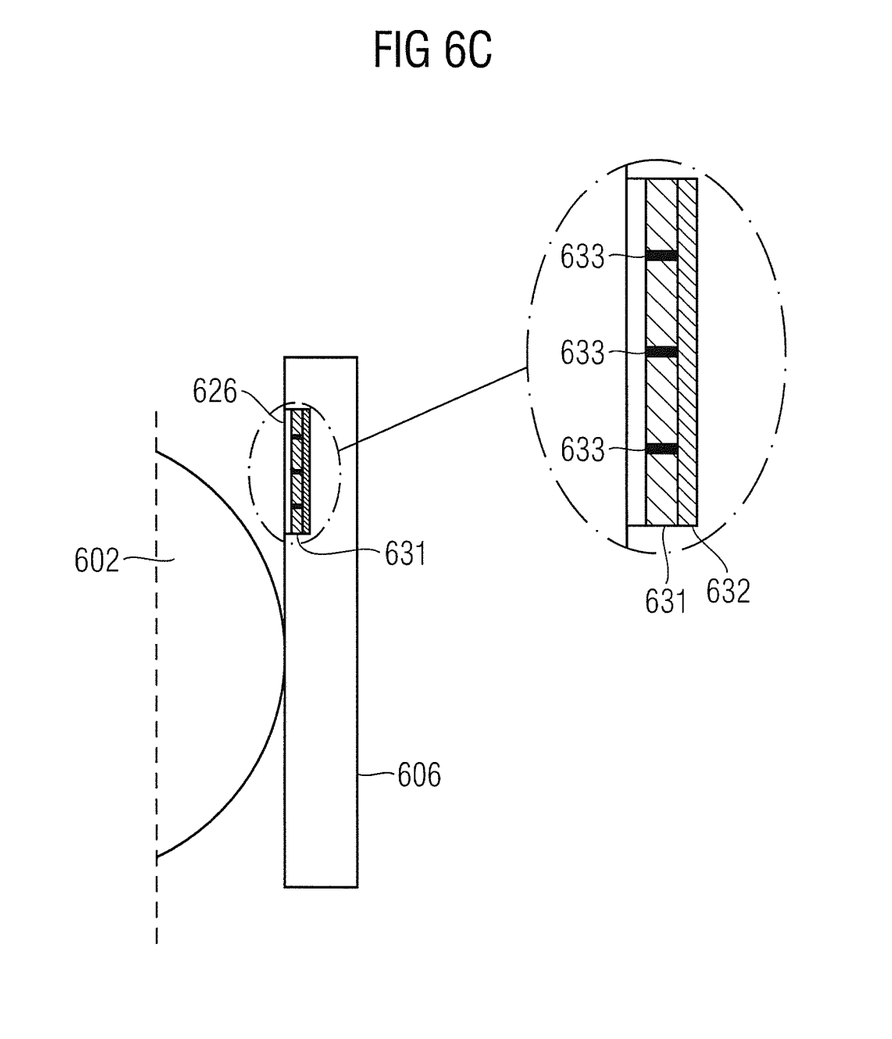

FIG. 6 illustrates an electrostatic chuck 606 in accordance with an aspect of the disclosure. Electrostatic chuck 606 comprises a mount 602 that is vertically translatable (indicated by arrow 617 in FIG. 6). Mount 602 may further be tilted upwards and downwards (indicated by arrow 619 in FIG. 6) about the y-axis to better facilitate implantation of ions, for instance. Even further, mount 602 may be rotatably moved about the z-axis (indicated by arrow 621 in FIG. 6). Moreover, electrostatic chuck 606 may also be rotated 360 degrees about its central axis (indicated by arrow 622 in FIG. 6). The electrostatic chuck 606 is attached to the mount 602.

As illustrated in 6B, the electrostatic chuck 606 may further comprise a gas cooling system 613. The gas cooling system 613 comprises a plurality of passages 613 running throughout the electrostatic chuck 606. Passages 613 terminate in holes 641 in the face of the electrostatic chuck 606. Gas may be supplied through the holes 641 to cool an attached substrate during processing. However, the use of gas during use of the high-voltage electrostatic chuck 606 with a SOG workpiece may result in electrical arcing. Therefore, in an aspect of the disclosure, the gas cooling system may be disabled when using the electrostatic chuck system with a SOG workpiece or other non-conducting carrier configuration, for instance.

As shown in expanded view 6C, electrostatic chuck 606 further comprises a connection terminal 626. Connection terminal 626 comprises a first insulating layer 631 enclosing electrical terminals 633 and separating high voltage connection plugs (not shown) from electrostatic chuck 606. In an aspect of the disclosure, first insulating layer 631 comprises silicone. Moreover, in a further aspect of the disclosure, a further insulating layer 632 is provided between the first insulating layer 631 and the electrostatic chuck 606. Further insulating layer 632 may be formed from epoxy resin with hardener composite, for instance. Further insulating layer 632 is advantageous because of the very high voltages used for various embodiments. Further insulating layer 632 may be formed from other materials suitable for high voltage insulating including, but not limited to, liquid silicone or polyimide, for example.

Now, a process flow according to an aspect of the disclosure will be described. Process flow is described with reference to FIG. 7.

Figure 7:
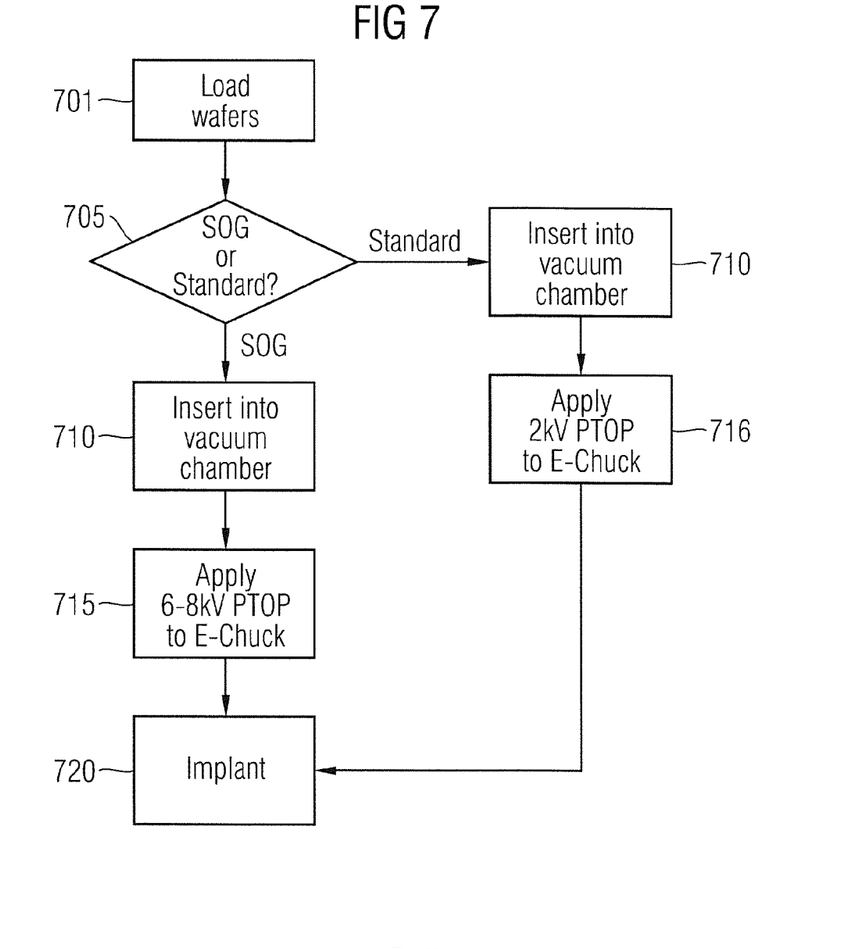
FIG. 7 illustrates a process in accordance with another aspect of the disclosure.

At 701, substrates are loaded into the substrate-handling system. Substrates may comprise either standard semiconductor substrates, or thin semiconductor substrates, for example. As discussed above, if thin silicon substrates are used, they will often be attached to a rigid carrier, such as a glass carrier, although the embodiments are not limited to glass. However, the various aspects of the disclosure include both conducting and non-conducting support carriers, and the disclosure should not be read as being limited to any particular support material.

The substrate-handling system includes a separate mechanical chuck for transporting the substrate. The mechanical chuck comprises projections for stabilizing the substrate. The mechanical projections contact thin substrates only on the glass carrier portion of the SOG workpiece. Moreover, the mechanical projections do not grasp the glass carrier, to minimize the potential for damage to the glass carrier. Rather, they merely stabilize the substrate as it rests in the mechanical chuck. During the horizontal substrate-handling phase, the substrate only contacts parts made either of silicone or polyethylether ketone (PEEK), thus minimizing the risk of damage or contamination.

At 705, and prior to transfer into the vacuum chamber, the silicon or SOG workpiece is inspected using an optical sensing tool. The optical sensing tool uses light in the RGB range, for example. Optical sensing tool emits light in the appropriate frequency range, and the light either passes through glass carrier and is reflected off of the chuck, or it is reflected off of the chuck without passing through glass, depending on the type of substrate present. Optical sensing tool then detects the frequency of light reflected off of the surface of the substrate. The detected light is separated and detected according to frequency. The ratio of the frequencies of light is used to identify the type of substrate present. The sensor identifies the type of substrate according to previously defined criteria, and sends a signal to the high voltage power supply indicating what type of substrate is associated with a given position in the substrate handling system.

Based upon the signal, the high-voltage power supply and clamp current monitoring is then configured to output a certain voltage at step 715 or 716. In this way, the signal from optical sensor is used as an input to an interlock. The interlock is used to prevent the accidental application of high voltage to the incorrect type of substrate. Application of too high a voltage to a typical silicon substrate, for instance, could result in arcing, which could potentially damage the substrate and electrostatic chuck, possibly rendering the system useless.

At 710, substrate or SOG substrate is passed into the vacuum chamber for processing. The vacuum chamber may include any number of tools for processing substrates. In an embodiment, the chamber comprises an implant tool. The implant tool uses high voltages to implant atomic impurities into the substrate in doping processes. The species implanted may include boron (B), phosphorous (P), and arsenic (As) and hydrogen, for instance. However, the species implanted under this method are not limited by the disclosed electrostatic chuck, and thus should not be viewed as limiting. Any species that may be implanted using previously known substrate support mechanisms may be implanted using the electrostatic chuck disclosed herein.

The vacuum system further includes an electrostatic chuck in accordance with an aspect of the disclosure. As described above, electrostatic chuck is translatable in the X, Y and Z-directions. It is also tiltable in thus allowing angled implants of atomic species. Moreover, electrostatic chuck can also be rotated 360 degrees about the central axis of the substrate. This combination of movement allows for flexibility in the choice of implant locations.

Substrate is held in position by electrostatic forces according to aspects of the disclosure. As discussed above, a voltage of approximately 2000 V peak to peak is adequate to retain a standard silicon substrate on electrostatic chuck. If a standard silicon substrate was detected at step 705, a voltage of 2 kV peak to peak may be applied to the electrostatic chuck, as shown in step 716. However, in the case of a glass-mounted thin silicon substrate, a much higher voltage is needed due to the non-conducting nature of the glass carrier. Therefore, in an embodiment, at step 715 a voltage of approximately 6-8 kV peak to peak may be required for a thin silicon substrate having a 70 µm thickness mounted on an insulating (for example, glass) carrier. However, as discussed above, this voltage may vary widely, depending on application and nature of the insulating carrier. A thicker insulating carrier may require a higher voltage, for instance. Conversely, a thinner insulating carrier may require a lower voltage. Moreover, the disclosed embodiment is merely exemplary, and is not limited to insulating carriers comprising glass. The current disclosure is broadly applicable to all insulating carriers.

Electrostatic chuck allows for the processing of substrates at a variety of angles. This allows for high-angle implants on the backside of substrate, for instance. In an aspect of the disclosure, electrostatic chuck is used in conjunction with ion beam device to enable a Quad implant at step 720, for example.

In a Quad implant at step 720, substrate is tilted a high angle with respect to ion implantation device. In an aspect of the disclosure, the angle may be 45 degrees with respect to the ion implantation device, as shown in FIG. 6A. Following implantation, substrate is rotated approximately 90 degrees about its central axis. Substrate is further tilted to the same angle as used in the previous implantation step. Following rotation, a second implantation step is performed. In an aspect of the disclosure, the dose of a second implantation is performed. In an embodiment, the dose of the second implantation step is substantially equal to that of the first implantation step. This procedure is performed two more times, until a total of four rotation/implantation steps have been performed.

Moreover, in another aspect of the disclosure, electrostatic chuck system allows for a higher angle of implantation on silicon substrate-on-glass systems. Previous systems were limited to either mechanically clamped systems or to batch systems, which rely on centrifugal force to hold such substrates into place. The mechanical solution could potentially damage the substrate, as discussed above. The batch solution, while having the potential benefit of being less likely to cause damage, was limited in the extent that one could angle the substrate. The current disclosure, however, is not so limited.

Figure 8:
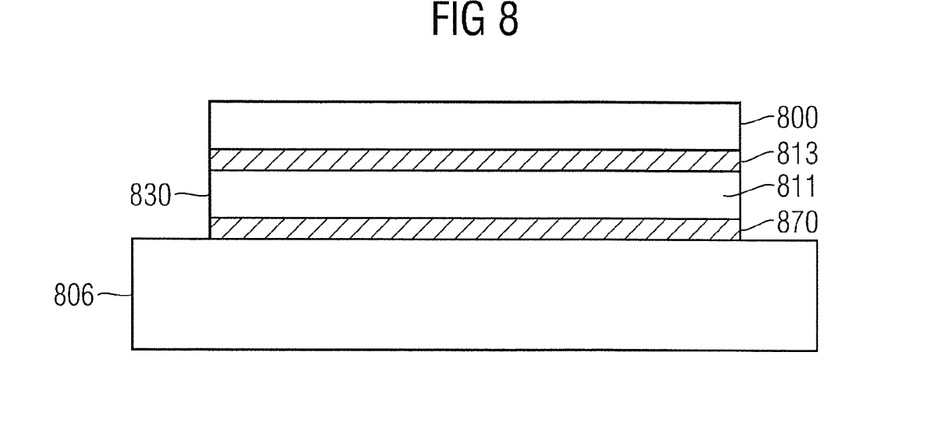
FIG. 8 illustrates a silicon on glass structure in accordance with another aspect of the disclosure.

As illustrated in FIG. 8, in another exemplary embodiment, metal is sputtered onto the glass carrier prior to bonding the thin silicon substrate to the glass carrier. This improves the conductivity of the glass carrier, thus improving the retention of the glass or other non-conducting support onto the electrostatic chuck.

As illustrated in FIG. 8, in this embodiment the glass carrier 811 is sputtered with a metal oxide 870, such as indium tin oxide (ITO), for instance. These oxides, or metals or metal oxides of similar properties, have certain advantages. They are electrically conducting, yet still transmissive to optical wavelengths of light, for instance. Use of a conducting material may allow for an increase in the amount of charge present at the electrostatic chuck/substrate interface, for instance, resulting in an increased retention force being applied to the substrate, for instance. Moreover, the ability of the material to transmit light may be advantageous for the application of light through the sputtered oxide film to the adhesive film, for instance, facilitating the removal of the adhesive film.

In the embodiment illustrated in FIG. 8, a conductive film 870, for example an ITO film 870, has been deposited on the glass carrier 811. The glass carrier 811 and film 870 are attached to semiconductor substrate 800 (for example, by an adhesive layer or layer stack 813, as shown), thus forming an SOG workpiece 830, in the case of semiconductor substrate 800 being formed of silicon. SOG workpiece 830 is positioned onto electrostatic chuck 806 so that the conductive film (e.g. ITO film) 870 is closest to electrostatic chuck 806. When a high voltage is applied to electrostatic chuck 806, the thin conductive film 870 allows for the greater electron migration to the surface of the film, thus allowing a greater induced charge at the surface. This results in greater adhesion of the glass carrier 811 to the electrostatic chuck 806. Processing proceeds normally from here.

A person skilled in the art will recognize that combinations of the exemplary embodiments described herein may be formed. For example, a configuration as the one shown in FIG. 2B or FIG. 4 may be employed with or without an applied conductive film deposited on the carrier 230, 431. Similarly, some or all aspects of the disclosure may be employed either in air or under vacuum, for instance. Moreover, the electrostatic chuck may be passed from tool to tool, along with the attached substrate. Moreover, the optical sensing device illustrated and discussed in FIGS. 3, 4, and 7 may be incorporated into the same vacuum chamber as the processing tool(s). Also, the electrostatic chuck and method for use disclosed herein are applicable to other types of substrates including conductive and non-conductive surfaces, such as flat panel displays, for instance.

A processing system in accordance with various embodiments may include: an electrostatic chuck for holding a semiconductor substrate attached to an electrically insulating carrier, wherein the electrically insulating carrier is disposed between the electrostatic chuck and the semiconductor substrate; an AC power supply electrically coupled to the electrostatic chuck; wherein the supplied voltage is dependent on at least one property of the electrically insulating carrier.

In accordance with an embodiment, the AC power supply may provide a voltage of at least 500 V peak to peak.

In accordance with another embodiment, the at least one property of the electrically insulating carrier may include thickness of the electrically insulating carrier.

In accordance with another embodiment, the thickness may be at least 0.2 mm.

In accordance with another embodiment, the at least one property of the electrically insulating carrier may include the material used to form the electrically insulating carrier.

In accordance with another embodiment, the supplied voltage may be further dependent on the weight of the semiconductor substrate and electrically insulating carrier.

In accordance with another embodiment, the system may further include a processing tool.

In accordance with another embodiment, the processing tool may be an implant device.

In accordance with another embodiment, the AC power supply may be a 6-phase high voltage AC power supply.

In accordance with another embodiment, the supplied voltage may be at least 3 kV peak to peak, for example in the range from about 6 kV to about 8 kV in accordance with another embodiment.

A processing system in accordance with various embodiments may include: an electrostatic chuck for holding a semiconductor substrate attached to an electrically insulating carrier, wherein the electrically insulating carrier is disposed between the electrostatic chuck and the semiconductor substrate; an AC power supply electrically coupled to the electrostatic chuck wherein the AC power supply provides a voltage of at least 500 V peak to peak.

In accordance with an embodiment, the supplied voltage may be at least 1 kV peak to peak.

In accordance with another embodiment, the supplied voltage may be dependent on a thickness of the electrically insulating carrier.

In accordance with another embodiment, a thickness of the semiconductor substrate may be less than or equal to about 200 μm.

In accordance with another embodiment, a thickness of the semiconductor substrate may be less than or equal to about 100 μm.

In accordance with another embodiment, the supplied voltage may be dependent on a material used to form the electrically insulating carrier.

In accordance with another embodiment, the supplied voltage may be further dependent on the weight of the semiconductor substrate and electrically insulating carrier.

In accordance with another embodiment, the system may further include a processing tool.

In accordance with another embodiment, the processing tool may be an implant device.

In accordance with another embodiment, the AC power supply may be a 6-phase high voltage AC power supply.

In accordance with another embodiment, the supplied voltage may be at least 3 kV peak to peak, for example in the range from about 6 kV to about 8 kV in accordance with another embodiment.

A method of manufacturing a device in accordance with various embodiments may include: providing a semiconductor substrate; attaching the semiconductor substrate to an electrically insulating carrier; supporting the semiconductor substrate and electrically insulating carrier with an electrostatic chuck, the electrically insulating carrier being disposed between the electrostatic chuck and the semiconductor substrate; wherein a voltage supplied to the electrostatic chuck is related to at least one property of the electrically insulating carrier.

In accordance with an embodiment, attaching the semiconductor substrate to the electrically insulating carrier may include attaching the semiconductor substrate such that a front side of the semiconductor substrate faces the electrically insulating, carrier.

In accordance with another embodiment, the at least one property may be a thickness of the electrically insulating carrier.

In accordance with another embodiment, the at least one property may be the material used to form the electrically insulating carrier.

In accordance with another embodiment, the voltage supplied to the electrostatic chuck may be a high voltage.

In accordance with another embodiment, the high voltage may be at least 500 V peak to peak.

In accordance with another embodiment, the high voltage may range from 6-8 kV peak to peak. In other words, the high voltage may be in the range from 6 kV to 8 kV peak to peak.

In accordance with another embodiment, the electrically insulating carrier may further include a conductive layer. In an embodiment, the conductive layer may, for example, be disposed over a side of the electrically insulating carrier facing the electrostatic chuck.

In accordance with another embodiment, the conductive layer may be optically transmissive.

In accordance with another embodiment, the semiconductor substrate may be a 300 mm substrate, for example a 300 mm wafer in accordance with another embodiment.

In accordance with another embodiment, the method may further include implanting the substrate.

In accordance with another embodiment, the implanting may be done according to a Quad implant process.

In accordance with another embodiment, the implant process may be a backside implant process.

While the invention has been particularly shown and described with reference to specific aspects of the disclosure, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A processing system, comprising:
    an electrostatic chuck for holding a workpiece, the workpiece comprising a semiconductor substrate attached to an electrically insulating carrier, wherein, when the electrostatic chuck holds the workpiece, the electrically insulating carrier of the workpiece is disposed between the electrostatic chuck and the semiconductor substrate of the workpiece;
    an AC power supply electrically coupled to the electrostatic chuck;
    wherein the workpiece is held against the electrostatic chuck by an electrostatic force generated by a voltage supplied to the electrostatic chuck;

wherein the supplied voltage is dependent on at least one property of the electrically insulating carrier.

2. The system of claim 1, wherein the AC power supply provides a voltage of at least 500 V peak to peak.

3. The system of claim 1, wherein the at least one property of the electrically insulating carrier comprises thickness of the electrically insulating carrier.

4. The system of claim 3, wherein the thickness comprises at least 0.2 mm.

5. The system of claim 1, wherein the at least one property of the electrically insulating carrier comprises the material used to form the electrically insulating carrier.

6. The system of claim 1, wherein the supplied voltage is further dependent on the weight of the semiconductor substrate and electrically insulating carrier.

7. The system of claim 1, further comprising a processing tool.

8. The system of claim 7, wherein the processing tool is an implant device.

9. The system of claim 1, wherein the AC power supply is a 6-phase high voltage AC power supply.

10. The system of claim 1, wherein the supplied voltage is at least 3 kV peak to peak.

11. A processing system, comprising:
an electrostatic chuck for holding a workpiece, the workpiece comprising a semiconductor substrate attached to an electrically insulating carrier, wherein, when the electrostatic chuck holds the workpiece, the electrically insulating carrier of the workpiece is disposed between the electrostatic chuck and the semiconductor substrate of the workpiece;
an AC power supply electrically coupled to the electrostatic chuck wherein the AC power supply provides a voltage of at least 500 V peak to peak;
wherein the workpiece is held against the electrostatic chuck by an electrostatic force generated by the provided voltage.

12. The processing system of claim 11, wherein the supplied voltage is at least 1 kV peak to peak.

13. The system of claim 11, wherein the supplied voltage is dependent on a thickness of the electrically insulating carrier.

14. The system of claim 11, wherein a thickness of the semiconductor substrate is less than or equal to 200 µm.

15. The system of claim 11, wherein a thickness of the semiconductor substrate is less than or equal to 100 µm.

16. The system of claim 11, wherein the supplied voltage is dependent on a material used to form the electrically insulating carrier.

17. The system of claim 13, wherein the supplied voltage is further dependent on the weight of the semiconductor substrate and electrically insulating carrier.

18. The system of claim 11, further comprising a processing tool.

19. The system of claim 18, wherein the processing tool is an implant device.

20. The system of claim 11, wherein the AC power supply is a 6-phase high voltage AC power supply.

21. The system of claim 11, wherein the supplied voltage is at least 3 kV peak to peak.

22. A method of manufacturing a device, the method comprising:
providing a semiconductor substrate;
attaching the semiconductor substrate to an electrically insulating carrier, thereby forming a workpiece;
supporting the workpiece, which comprises the semiconductor substrate and the electrically insulating carrier, with an electrostatic chuck, the electrically insulating carrier of the workpiece being disposed between the electrostatic chuck and the semiconductor substrate of the workpiece;
wherein the workpiece is held against the electrostatic chuck by an electrostatic force generated by a voltage supplied to the electrostatic chuck;
wherein a voltage supplied to the electrostatic chuck is related to at least one property of the electrically insulating carrier of the workpiece.

23. The method of claim 22, wherein attaching the semiconductor substrate to the electrically insulating carrier comprises attaching the semiconductor substrate such that a front side of the semiconductor substrate faces the electrically insulating carrier.

24. The method of claim 22, wherein the at least one property is a thickness of the electrically insulating carrier.

25. The method of claim 22, wherein the at least one property is the material used to form the electrically insulating carrier.

26. The method of claim 22, wherein the voltage supplied to the electrostatic chuck is a high voltage.

27. The method of claim 26, wherein the high voltage is at least 500 V peak to peak.

28. The method of claim 26, wherein the high voltage ranges from 6-8 kV peak to peak.

29. The method of claim 22, wherein the electrically insulating carrier further comprises a conductive layer.

30. The method of claim 29, wherein the conductive layer is optically transmissive.

31. The method of claim 22, wherein the semiconductor substrate is a 300 mm substrate.

32. The method of claim 22, further comprising implanting the substrate.

33. The method of claim 32, wherein the implanting is done according to a Quad implant process.

34. The method of claim 32, wherein the implant process is a backside implant process.

* * * * *